United States Patent
Self et al.

(10) Patent No.: US 7,006,543 B2
(45) Date of Patent: Feb. 28, 2006

(54) SYSTEM AND CIRCUIT FOR A MULTI-CHANNEL OPTOELECTRONIC DEVICE DRIVER

(75) Inventors: David Wayne Self, Tempe, AZ (US); Benjamim Tang, Rancho Palos Verdes, CA (US); Kevin Miyashiro, Redondo Ranch, CA (US)

(73) Assignee: Primarion, Inc., Phoenix, AZ (US)

(*) Notice: Subject to any disclaimer, the term of this patent is extended or adjusted under 35 U.S.C. 154(b) by 226 days.

(21) Appl. No.: 10/633,074

(22) Filed: Aug. 1, 2003

(65) Prior Publication Data

US 2004/0212867 A1 Oct. 28, 2004

Related U.S. Application Data

(60) Provisional application No. 60/407,496, filed on Aug. 30, 2002, provisional application No. 60/407,495, filed on Aug. 30, 2002, provisional application No. 60/407,493, filed on Aug. 30, 2002, provisional application No. 60/407,494, filed on Aug. 30, 2002.

(51) Int. Cl.
*H01S 3/00* (2006.01)

(52) U.S. Cl. .............................. 372/38.02; 372/38.07
(58) Field of Classification Search ............ 372/38.02, 372/38.07

See application file for complete search history.

(56) References Cited

U.S. PATENT DOCUMENTS

| | | | | |
|---|---|---|---|---|
| 5,666,045 | A | * | 9/1997 | Grodevant ................... 323/282 |
| 5,883,910 | A | * | 3/1999 | Link ....................... 372/38.07 |
| 6,389,050 | B1 | * | 5/2002 | Stronczer .................. 372/38.02 |
| 6,618,406 | B1 | * | 9/2003 | Kaminishi ............... 372/38.02 |
| 2002/0186733 | A1 | * | 12/2002 | Vaughan .................. 372/38.02 |
| 2003/0086455 | A1 | * | 5/2003 | Ciubotaru et al. ....... 372/38.02 |

* cited by examiner

*Primary Examiner*—Minsun Oh Harvey
*Assistant Examiner*—Tod T. Van Roy
(74) *Attorney, Agent, or Firm*—T. E. Galanthay

(57) ABSTRACT

Disclosed is a system and circuit for a multi-channel optoelectronic device driver. The system and circuit include a differential buffer amplifier, an output driver amplifier, a dedicated voltage regulator, a load compensation circuit, a wave shaping circuit and a laser fault detection circuit. In a multi-channel configuration, each channel has a dedicated voltage regulator such that each channel provides a channel-specific drive signal.

13 Claims, 6 Drawing Sheets

SYSTEM AND CIRCUIT FOR A MULTI-CHANNEL OPTOELECTRONIC DEVICE DRIVER

CROSS REFERENCE TO RELATED APPLICATIONS

This patent application claims priority to, and the benefit of, U.S. provisional patent applications identified as follows:
1. Provisional Application Ser. No. 60/407,496, entitled SYSTEM AND CIRCUIT FOR A MULTI-CHANNEL OPTOELECTRONIC DEVICE DRIVER Filed Aug. 30, 2002.
2. Provisional Application Ser. No. 60/407,495 entitled SYSTEM AND CIRCUIT FOR AN OPTOELECTRONIC DEVICE DRIVER Filed Aug. 30, 2002;
3. Provisional Application Ser. No.60/407,493 entitled SYSTEM FOR TRANSMITTING OPTOELECTRONIC INFORMATION Filed Aug. 30, 2002.
4. Provisional Application Ser. No. 60/407,494 entitled TRANSIMPEDANCE AMPLIFIER AND CIRCUIT INCLUDING THE SAME Filed Aug. 30, 2002.

The subject matter disclosed in all of the foregoing provisional patent applications is hereby incorporated herein by reference.

Additional cross references to related non-provisional patent applications, are as follows:
1. Ser. No. 10/359,155 filed on, Feb. 06, 2003, entitled: TRANSIMPEDANCE AMPLIFIER AND CIRCUIT INCLUDING THE SAME
2. Ser. No. 10/365,432 filed on Feb. 13, 2003, entitled: CURRENT DRIVER AND METHOD OF PRECISELY CONTROLLING OUTPUT CURRENT The subject matter disclosed in all of the foregoing non-provisional patent applications is hereby incorporated herein by reference.

FIELD OF THE INVENTION

The present invention generally relates to a system, circuits and techniques for driving light emitting devices, such as vertical cavity surface emitting lasers (VCSELs). More particularly, the invention relates to a multi-channel system and circuits for providing independent drive voltages to each laser diode in a laser diode array.

BACKGROUND OF THE INVENTION

As the rate of data transfer between microelectronic devices increases, use of typical electrical bus schemes to transmit information becomes increasingly problematic. In particular, as the amount of information transfer increases, an amount of input/output power required to transmit information between devices and consequently an amount of electronic noise associated with the transmission increase.

Another problem associated with transmission of electrical signals using traditional electrical bus systems is that signal attenuation and distortion increases as the rate of the transmitted signal increases. For example, when signals are transmitted at a rate of about 5 GHz using FR-4 substrate material, the signal suffers about a 5 dB loss across 10 cm. This loss can cause rise time degradation and amplitude loss for the signals as the higher order harmonics are filtered out. For high data rate transmission across greater lengths, potentially up to several kilometers, optical transmission is required. Accordingly, improved apparatus and systems for transmitting information between a plurality of microelectronic devices optically are desired. For the above reasons, although the majority of signal processing is done in the electrical domain, it has become highly advantageous to utilize optical communications to interconnect microelectronic devices.

In order to obtain the benefits of optical communications, electrical signals must be converted to optical signals and vice versa. Various high powered lasers have been developed in the telecommunication art for transmitting optical signals through optical fibers over long distances, such as many miles. Short to medium distance optical communications, such as within one box, or through optical cables that are not more than a few hundred meters in length, require various other light emitting devices different from those in use in the telecommunication art. For such short to medium distance applications, a variety of lasers including Fabry-Perot and vertical cavity surface emitting lasers (VCSELs) have been developed. However, specialized circuits are needed to advantageously utilize this technology. In particular, such lasers require specialized electronic drive circuits in order to modulate light output. There is a need in the art for improvements in such specialized circuits to accept high frequency signals, for example from a controller, and provide voltage waveforms to laser diode arrays. Laser diodes such as VCSEL's have unique characteristics requiring specific high frequency voltage waveforms to optimize performance and minimize the bit error rate (BER).

Additional problems arise in connection with fabricating a multi-channel system due to potentially specialized requirements to properly drive a plurality of lasers, e.g. an integrated laser diode array. Data throughput rates increase with parallel channels; however traditional laser drivers bias all of the parallel lasers with a single supply voltage resulting in less than optimum performance.

SUMMARY OF THE INVENTION

The present invention provides improved systems, circuits and techniques for driving light emitting devices such as lasers including Fabry-Perot and vertical cavity surface emitting lasers (VCSELs). Although, the exemplary embodiments of this invention will be primarily described in terms of VCSEL driver applications, the invention is applicable to all light emitting devices with similar characteristics requiring a precisely controlled high frequency voltage waveform. The VCSEL Driver's principal function is to interface a VCSEL diode to an electronic system for applications such as data communications or other optical signal processing. As will be described in greater detail herein below, this invention includes a differential buffer amplifier, an output driver, a dedicated voltage regulator, a load compensation circuit, a wave shaping circuit, and a laser fault detection circuit.

In accordance with one aspect of the invention, multiple circuit stages are provided for receiving the high frequency input signal and providing a desired voltage waveform for use by a laser diode. A buffer circuit receives the high frequency differential input signals and provides them to a driver amplifier adapted to drive a laser diode. A voltage regulator dedicated to the selected channel provides an input to a driver amplifier. The driver amplifier receives the output of the dedicated voltage regulator to provide a customized voltage waveform to a laser diode. This feature of the invention is particularly advantageous in a multi-channel system by providing a channel-specific drive signal to each laser diode in the array.

In accordance with another aspect of the invention, the shape of the voltage waveform to be supplied to a laser diode is modified. In accordance with this wave shaping, a feature of the invention is to provide a compensation load to improve the square wave shape of the driver amplifier output waveform. Another feature of the invention is to improve the data eye, as is explained in greater detail herein below.

In accordance with a still further aspect of the invention, laser fault detection is provided. In particular, open circuit fault detection is difficult with a voltage mode laser driver due to the ambiguous output voltage range in a laser diode open circuit fault condition. It is a feature of the invention to provide laser diode current monitoring and provide open circuit fault detection.

The described embodiments can be implemented in bipolar junction transistor (BJT), heterojunction bipolar transistor (HBT), MOSFET, CMOS, or any other complementary transistor technology. The details of those processes are well known to those skilled in the semiconductor arts and are not described in detail herein.

BRIEF DESCRIPTION OF THE DRAWINGS

A more complete understanding of the present invention may be derived by referring to the detailed description and claims, considered in connection with the figures, wherein like reference numbers refer to similar elements throughout the figures, and:

Those skilled in the art will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention. Also, in the detailed description of the exemplary embodiments, NPN bipolar transistors and P channel or N channel field effect transistors are shown, other technologies for implementing the invention are not specifically described.

DETAILED DESCRIPTION OF EXEMPLARY EMBODIMENTS

The present invention may be described herein in terms of various functional components and various processing steps. It should be appreciated that such functional components may be realized by any number of hardware or structural components configured to perform the specified functions. For example, the present invention may employ various integrated components comprised of various electrical devices, e.g., resistors, transistors, capacitors, diodes and the like, whose values may be suitably configured for various intended purposes. Further, it should be noted that while various components may be suitably coupled or connected to other components within exemplary circuits, such connections and couplings can be realized by direct connection between components, or by connection through other components and devices. Also, for ease of explanation and understanding of the present invention, superfluous details have not been included.

Figure 1:
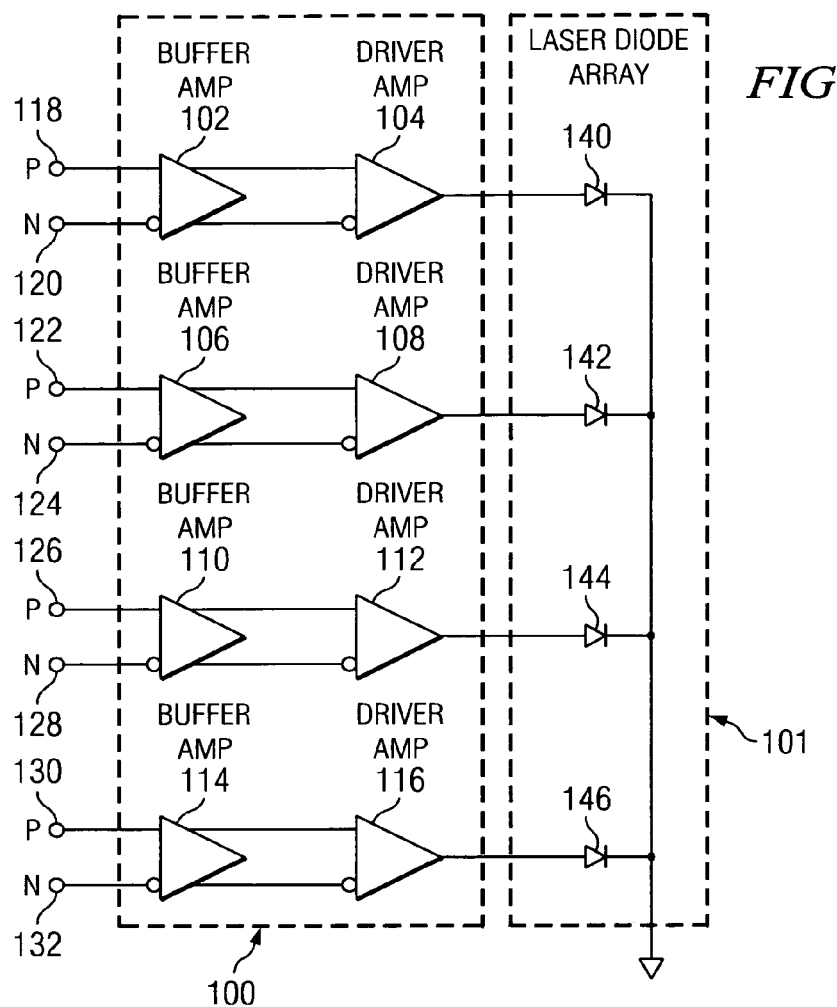
FIG. 1 is a block diagram illustration of the system for driving optoelectronic devices in accordance with the present invention.

FIG. 1 schematically illustrates a multi-channel system 100 suitable for driving an array of light emitting devices 101. Although four channels are shown for purposes of illustration, any number of independently controlled channels or just a single channel could be utilized. A first channel comprises an input stage, such as buffer amplifier 102 adapted to receive a differential input signal (P and N) at inputs 118, and 120, respectively. The output of buffer amplifier 102 (shown as a differential output signal) is connected to the input of driver amplifier 104. The output of driver amplifier 104 is connected to drive VCSEL 140. Although the system and circuits of this invention can drive other devices, preferably optoelectronic light emitting devices, such as lasers, they are conveniently described as driving vertical cavity surface emitting lasers, i.e. VCSEL's.

The other channels are configured similarly to the first channel. A second channel is illustrated with buffer amplifier 106 having inputs 122 and 124, and driver amplifier 108 driving VCSEL 142. The third channel is illustrated with buffer amplifier 110 having inputs 126 and 128, and driver amplifier 112 driving VCSEL 144. The fourth channel is illustrated with buffer amplifier 114 having inputs 130 and 132, and driver amplifier 116 driving VCSEL 146. In a multi-channel configuration, an array of lasers 101, such as the illustrated VCSEL's, is typically formed as an integrated array. The fabrication and integration of such arrays is well known and, in fact, commercially available and therefore requires no additional detail here.

In accordance with the illustrated embodiment of the invention, each of the buffer amplifiers, e.g. 102 is configured to condition the input signal for subsequent processing, and each of the driver amplifiers, e.g. driver amplifier 104, is configured to provide regulated power to drive each laser, e.g. 140.

In operation, system 100 receives electronic information (e.g., from a switch, controller or computer system) at ports 118–132 into the respective buffer amplifier for signal conditioning. The electronic information is then transmitted to a driver amplifier, e.g. 104 for regulation and amplification prior to being inputted to the respective laser. In accordance with a preferred embodiment of the invention, each driver amplifier, e.g. 104 is configured as a voltage mode output driver configured to supply independent channel biasing to the illustrated common cathode laser diode array 101. Supplying independent channel biasing to a common cathode laser array allows for greater channel bit error rate (BER) performance.

Figure 2:
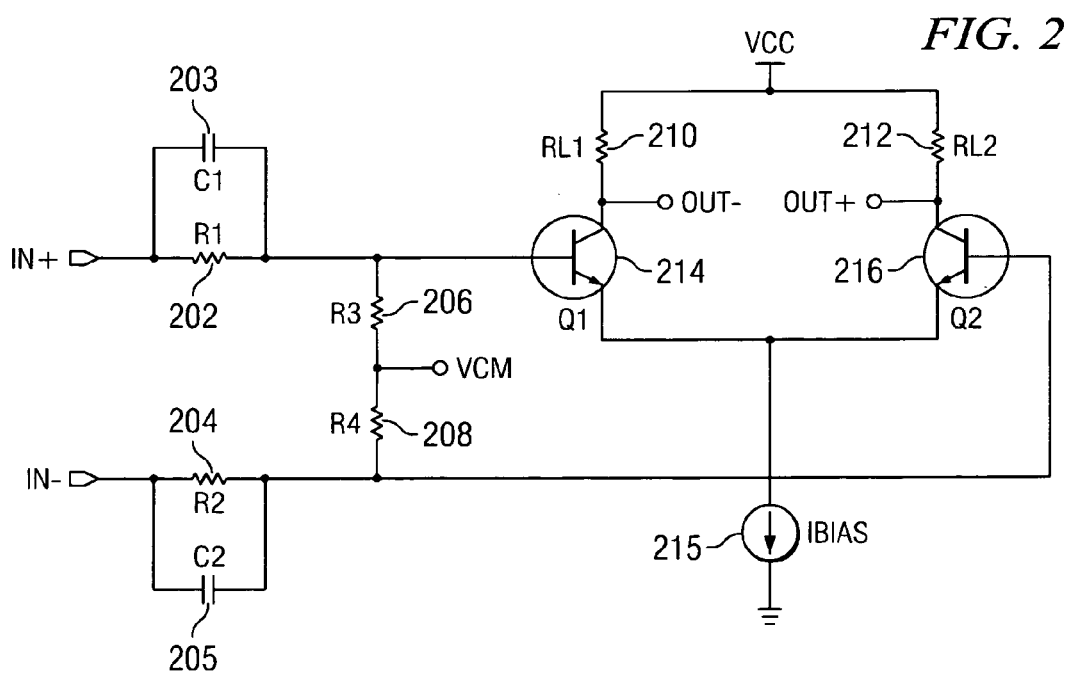
FIG. 2 is a circuit diagram illustrating an exemplary input stage for use as a buffer amplifier in the block diagram of FIG. 1.

Refer now to FIG. 2, which illustrates a buffer amplifier, e.g. 102 in FIG. 1 in greater detail. The differential inputs (IN+ and IN−) are received at resistors 202 and 204. Optional capacitors 203 and 205 can be placed in parallel with resistors 202 and 204. When included as part of the circuit, capacitors 203 and 205 are used as high frequency feed forward elements. Resistors 206 and 208 form a voltage divider connected between resistor 202 and 204 and have a common connection at common mode voltage terminal $V_{cm}$. Resistor 202 is also connected to the base of transistor 214; while resistor 204 is connected to the base of transistor 216. Transistors 214 and 216 have their emitters connected in common and to a current bias source 215. Potential source Vcc is coupled to the collector of transistor 214 by load resistor 210, and to the collector of transistor 216 by load resistor 212. The differential output signal is provided at each of the collectors, the illustrated output polarity corresponding to the illustrated input polarity.

The resistive divider (202 and 204) coupled to the differential amplifier (214 and 216) are configured to operate over relatively large deviations in common-mode voltages and relatively large deviations in input amplitude. This wide dynamic range is achieved with the illustrated embodiment showing the resistive divider connected to a high gain stage. Note that in the following formulas, the values of the previously describe resistors are noted as resistances: R1, R2, R3, R4, RL1 and RL2. Also, since the circuit functions without the optional capacitors, its operation will be described for the case when 203 and 205 are not installed. In operation, the voltage gain/attenuation from IN+ to the + input of the differential amplifier at the base of 214 can be given as $$A_{VI} = \frac{R_3}{R_1 + R_3}. \tag{1}$$

The same gain/attenuation is achieved from IN− to the − input of the differential amplifier at the gate of 216. Thus, a large input amplitude can be reduced by simply increasing the attenuation factor of $A_{V1}$. The attenuation needs to be limited such that the minimum detectable signal level in the differential amplifier stage is maintained. The net differential gain from IN(+,−) to OUT(−,+) is $$|A_V| = \frac{R_3}{R_1 + R_3} g_{mI}(R_L \| r_{OI}) \tag{2}$$

assuming that R1=R3, R2=R4, Q1=Q2, and RL1=RL2. Therefore, a wide range of input amplitude levels can be received by a combination of attenuation and amplification.

In order to tolerate a wide range of common-mode voltages, a Vcm bias is used, as shown in FIG. 2. Vcm can be as high as Vcc, or lower. If a common-mode voltage Vcm_in is used at the inputs IN+/IN−, then the common-mode voltage presented at the inputs of the differential amplifier is $$Vin = V_{CM}\left(1 - \frac{R3}{R1 + R3}\right) + V_{CM\_IN}\left(\frac{R3}{R1 + R3}\right) \tag{3}$$

The effect of this bias configuration will tend to "pull" Vin higher. Thus, common-mode voltage interfaces that are low will end up at a higher value, and common-mode interfaces that are high will stay that way. This type of common-mode biasing is best used in CML-type circuits, where high common-mode voltages are common.

Finally, to keep the power dissipation low, the resistive network can be made up of large resistors, such that $$I_{IN} = \frac{V_{CM} - V_{CM\_IN}}{R_1 + R_3} \tag{4}$$

$I_{in}$ can be minimized.

Figure 3:
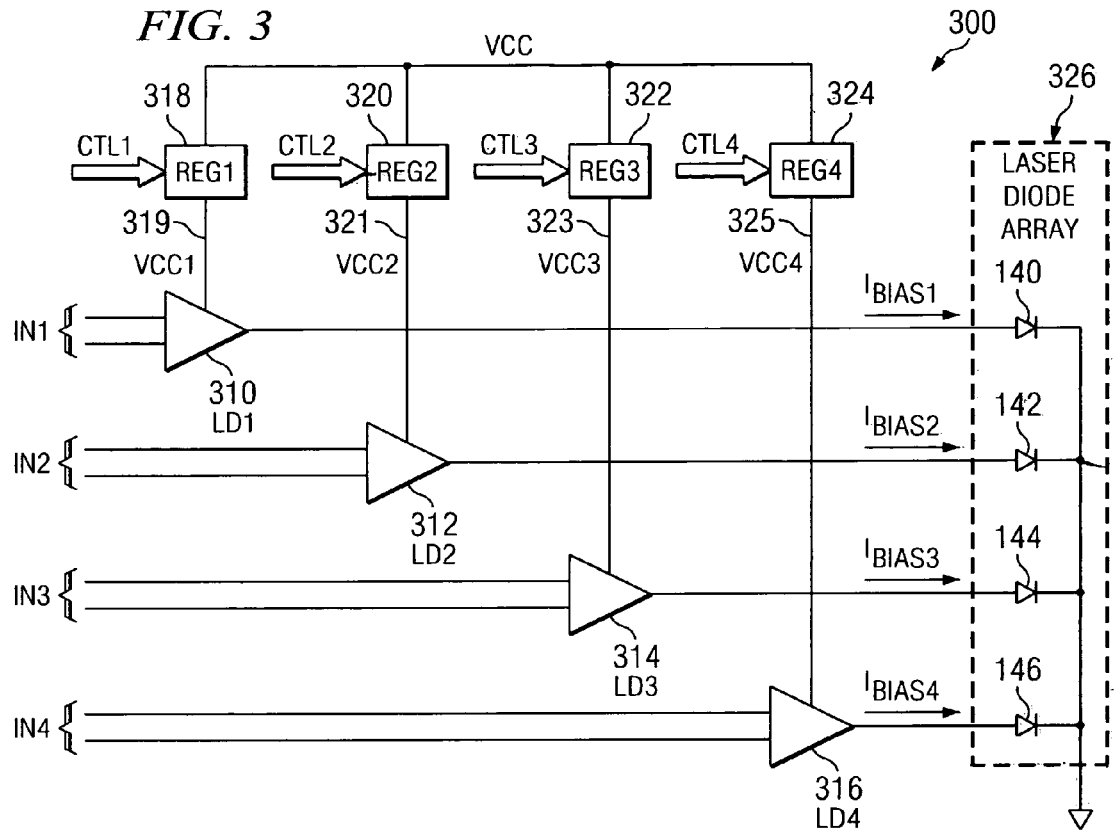
FIG. 3 is a block diagram illustrating the multi-channel driver embodiment in accordance with the present invention.

Refer now to FIG. 3, which illustrates the output stage driver amplifiers (e.g. 104 in FIG. 1) in greater detail. In accordance with one embodiment of the invention, output stage 104 (comprising regulator 318 and driver amplifier 310) is configured to supply independent channel biasing to laser 140. In the case of multiple channels, each channel is independently regulated to provide a customized voltage to each laser in a common cathode laser diode array 326. Although each anode in the laser diode array 326 is independently biased and supplied with a channel specific supply voltage, the cathodes are connected in common to ground potential. Supplying independent channel biasing to a common cathode laser array is desirable because it is thought to allow for greater channel bit error rate (BER) performance.

Thus, FIG. 3 illustrates an exemplary array of driver amplifiers 310–316, which may be used as amplifiers 104, 108, 112, and 116, as illustrated in FIG. 1. Amplifiers 310–316 are generally configured to provide regulated power to an array of lasers. In the illustrated embodiment of the invention, each laser 140–146 is coupled to an amplifier 310–316, which in turn is coupled to a respective independently controlled regulator 318–324. This configuration allows an independently regulated voltage to be supplied to each laser 140–146 within an array 326. In this case, each laser driver is coupled to a separate voltage regulator that sets a common mode voltage for the respective laser driver. The common mode voltage for each regulator 318–324 may be set or programmed using control signals CTL1–CTL4, which are received from an external source, such as a controller. Voltage regulators for providing a regulated voltage in response to a control signal are well known. The control signal can be either digital or analog. In accordance with the currently described embodiments, the control signals are preferably digital. Each voltage regulator output is set by its control signal to a value that will result in an optimum VCSEL bias current; which may be determined by a system test or diode characterization.

Although multi-channel amplifier 300 is illustrated with four channels, each including a regulator 318–324 and amplifier 310–316 connected by conductors 319, 321, 323, and 325, output stage circuits in accordance with the present invention may include various numbers of channels, wherein at least two of the channels are independently controlled. Similarly, although array 326 is illustrated with four light emitting devices, light emitting arrays in accordance with the present invention may include any suitable number of light emitting devices. The disclosed embodiments are also useful if only a single channel is used.

Figure 4:
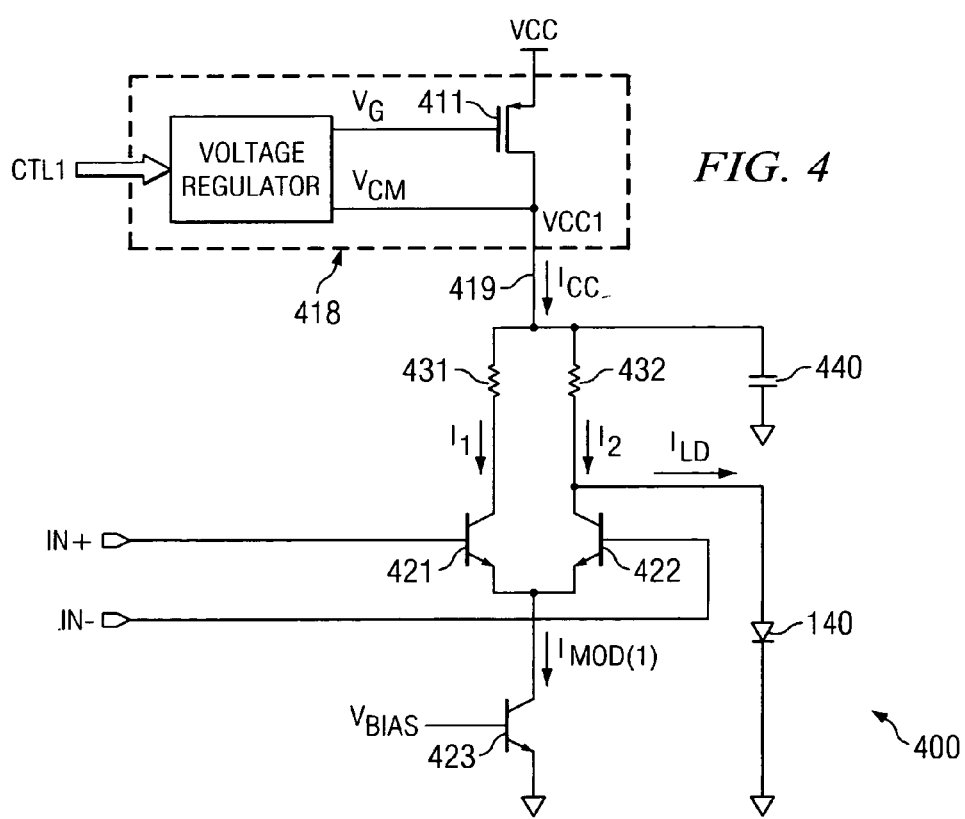
FIG. 4 is a circuit diagram, illustrating a driver output stage in accordance with the present invention.

A more detailed circuit diagram for a single channel laser driver (e.g. 310 in FIG. 3) is illustrated in FIG. 4. Typically, all channels in a multi-channel system will have a similar laser diode amplifier circuit. In the exemplary illustrated embodiment, laser driver amplifier 400 is a differential amplifier, which includes differential pair of transistors 421 and 422 and resistors 431 and 432, configured to produce a voltage mode output. The differential input is received at the base of transistor 421 and transistor 422. The common mode voltage of the differential pair is set by a voltage regulator 418 including a PFET pass device, 411 connected by conductor 419 to the common connection of resistors 431 and 432. This common mode voltage, $V_{CM}$, (effectively the supply voltage $V_{cc1}$ for channel 1) sets the effective laser diode bias current, $I_{LD}$. Laser diode modulation current is set by the NPN current source 423 connected to the common emitter connection of transistors 421 and 422. In this case, the DC bias current is determined by $V_{cc(1)}$, resistor 432 and $I_{MoD(1)}$. Because the value of resistor 432 is generally fixed and $I_{MoD(1)}$ is generally preset, a variable laser current is altered by varying $V_{cc(1)}$, allowing each laser to be independently tuned to increase bit error rate (BER) performance. As noted, In the FIG. 4 illustration, $Vcc_1$ is the regulated voltage for laser diode 140. Similarly, a corresponding similar driver circuit would receive $V_{cc2}$ for channel 2 laser 142 and so forth for the other channels.

With continued reference to FIG. 4, there is also illustrated bypass capacitor 440 connected between the applied common mode voltage ($V_{cc1}$) and ground potential. As is known, ground potential is a common potential that is fixed at a potential value more negative than the applied common mode voltage ($V_{cc1}$). Generally, a voltage regulator (e.g., regulator 418) adequately regulates a voltage at low frequencies, and supplies the transient current required to maintain this regulated voltage ($V_{cc1}$). But the practical upper frequency limit for a regulator is about 10 kHz to about 1 MHz. Above this frequency, the voltage regulator output is typically poorly regulated, and exhibits a higher impedance than desired.

At high frequencies, bypass capacitor 440 provides transient current. The value of capacitor 440 is practically limited by chip area. Therefore, a reasonable capacitance value can only provide adequate bypassing above approximately 1 GHz. The range of frequencies in between, not tracked well by a voltage regulator and not bypassed well by the capacitance, may require further circuit modifications. For example, see FIG. 5 which illustrates a laser driver output with a 10 MHz square wave. The illustrated waveform distortion is due to the excessive transient current that the laser driver might be unable to supply at this frequency.

Figure 5:
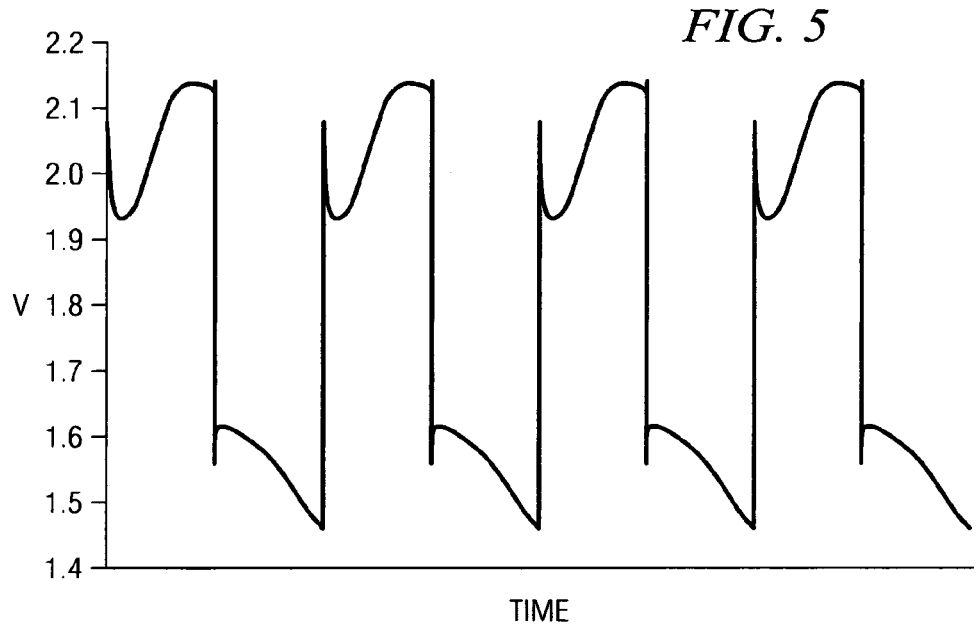
FIG. 5 is a waveform diagram illustrating an exemplary waveform, without load compensation.
Figure 6:
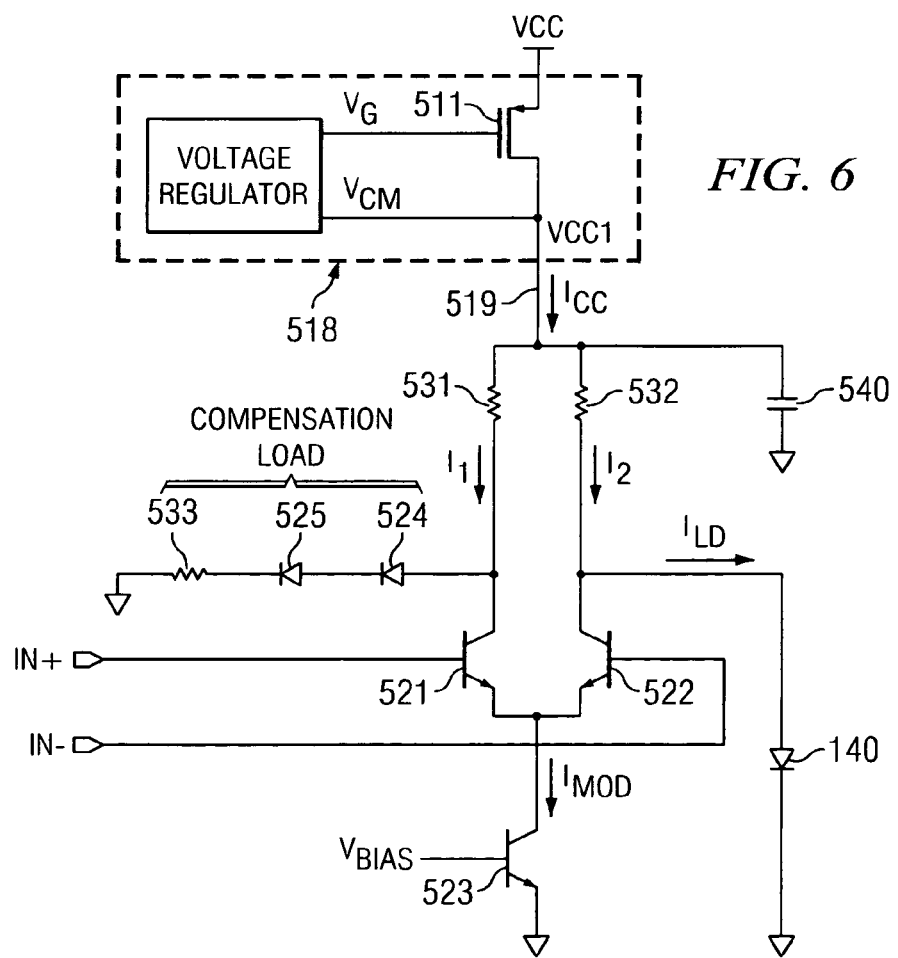
FIG. 6 is a circuit diagram illustrating a driver circuit in accordance with another embodiment of the invention.

In order to improve the waveform of FIG. 5, the circuit of FIG. 6 is provided. The circuit of FIG. 6 is similar to the circuit of FIG. 4. It includes a differential amplifier (transistors 521 and 522), current source 523, load resistors 531 and 532, bypass capacitor 540 and laser 140. It also includes voltage regulator 518, with PFET 511 connected by conductor 519 to the common connection of resistors 531 and 532. In addition, the circuit of FIG. 6 also includes a compensation circuit (comprising resistor 533 and diodes 524 and 525). This internal loading reduces transient current and improves output waveform quality. This internal load demands approximately the same transient current in the opposite phase from the laser diode current. The result is a true differential operation of the output stage, reducing the transient current from the supply. An additional benefit of this load compensation is the reduction of supply-induced noise. The matched transient currents now have a local return and will not be forced to the supply plane. The result is lower crosstalk between channels and/or transmit paths.

Figure 7:
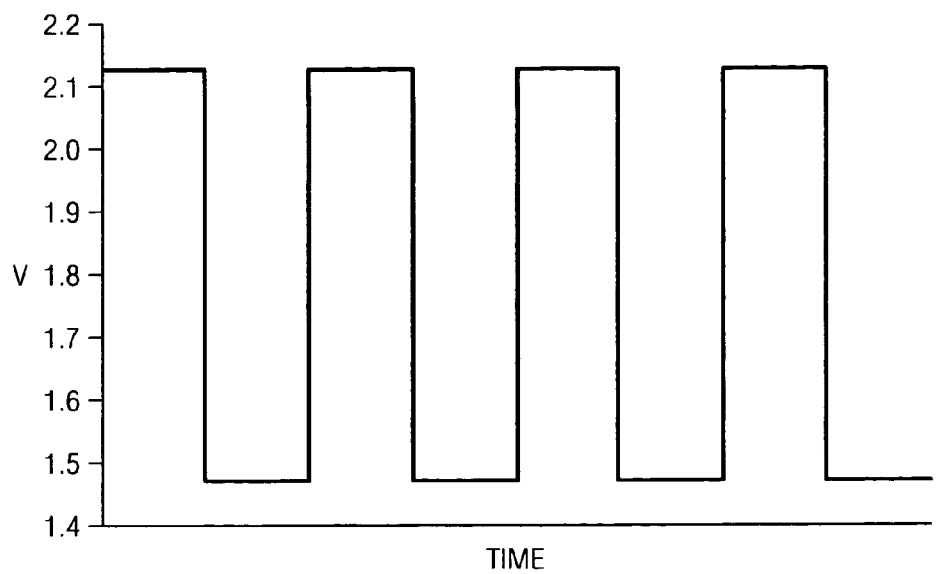
FIG. 7 is a waveform diagram illustrating the operation of the driver circuit with load compensation.

Those skilled in the art will recognize that diodes 524 and 525 can be conveniently implemented as two diode-connected NPN transistors. These transistors as well as resistor 533 are sized to match the I-V slope of the laser diode. An example of the 10 MHz output waveform with internal load compensation is illustrated in FIG. 7. Significant improvement is exhibited over the uncompensated case illustrated in FIG. 5. The beneficial result of load compensation as illustrated by the waveform in FIG. 7, ideally, is a perfect square wave. In practice, a falling edge bounce has been noted as is illustrated in FIG. 8.

Figure 8:
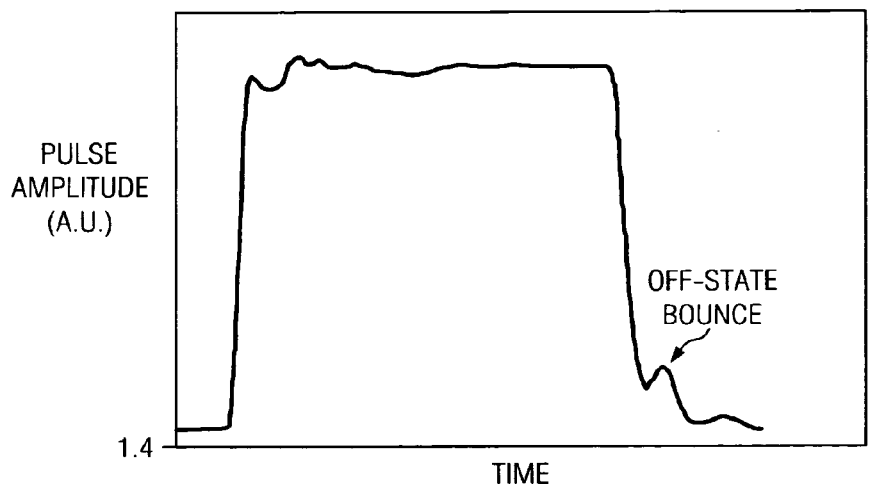
FIG. 8 is a waveform diagram.
Figure 9:
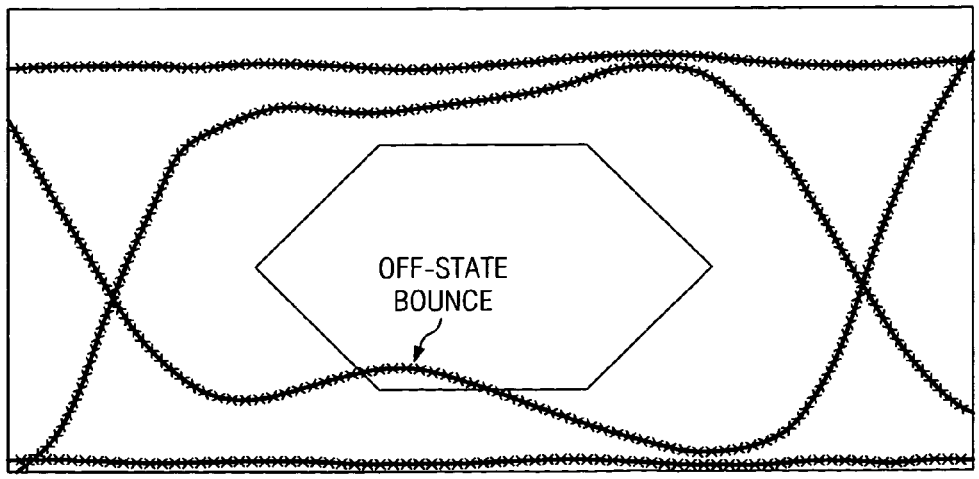
FIG. 9 is a waveform diagram illustrating a data eye.

FIG. 8 illustrates a pulse amplitude versus time graph for a VCSEL diode, showing falling-edge bounce identified as off-state bounce in the signal. The presence of this falling-edge bounce can have a negative effect on the hexagon shaped data eye, as shown in FIG. 9.

Figure 10:
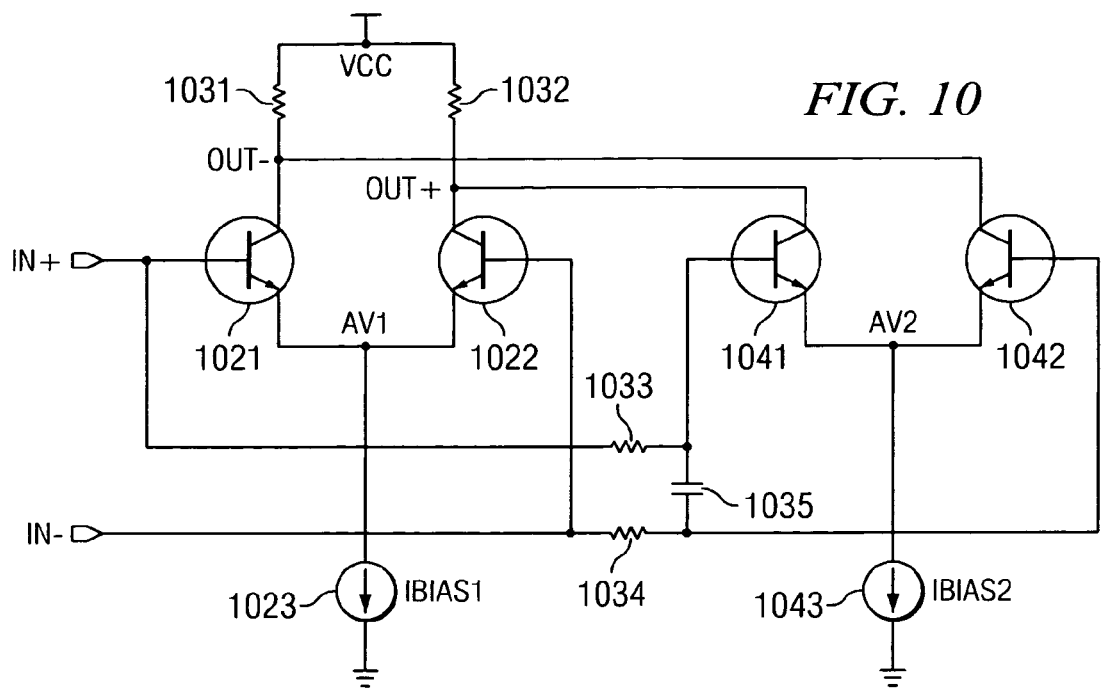
FIG. 10 is a circuit diagram illustrating the wave shaping circuit of the present invention.

FIG. 10 illustrates a circuit configured to compensate for the falling edge bounce (illustrated in FIG. 6) using wave form shaping techniques of the present invention. The wave form shaping techniques and circuits of the present invention may be applied to a broad range of applications, e.g., to counteract roll-off in dispersive channels, suppress peaking effects, and in the case of the laser driver amplifier, compensate for the falling edge bounce. Additionally, such circuits can help to make the rising and falling edge transitions sharper, which tends to help data eye integrity.

The circuit of FIG. 10 includes two amplifiers, Av1 and Av2. Av1 includes first and second differentially connected transistors 1021, 1022, first current source 1023 and load resistors 1031 and 1032. Transistors 1021 and 1022 receive differential inputs at their base regions and provide outputs at their collector regions. Their emitters are connected in common and to the current source 1023. Av2 includes third and fourth differentially connected transistors 1041 and 1042, with their emitters connected in common and to second current source 1043. Differential inputs are coupled to the base of transistors 1041 and 1042 through series connected resistors 1033 (value $R_{f2}$) and 1034 (value $R_{f1}$), respectively. The first differential input (IN+) is coupled to the base of transistors 1021 and 1041 and the second differential input is coupled to the base of transistors 1022 and 1042. Capacitor 1035 (value $C_{f1}$) is connected to both resistor 1033 and resistor 1034. Resistors 1033 and 1034, with capacitor 1035 form a time delay network. Thus, the inputs to Av2 are delayed relative to the inputs to AV1 by an RC time constant, generated by $$t_{()} = R_{f1}C_{f1} \quad (1)$$

A similar delay is generated through $R_{f2}$ and $C_{f1}$. Note that the outputs of Av2 are cross-coupled to Av1, i.e., Av2_out+ is tied to Av1_out−, and Av2_out− is tied to Av1_out+. Namely, the collector of transistor 1021 is coupled to the collector of transistor 1042 and the collector of transistor 1022 is coupled to the collector of transistor 1041. Thus, the net effect of this configuration will tend to subtract current from the output of Av1 after the RC time delay has passed. Thus, the output current will appear to have small overshoot and undershoot waveforms, which imply a small amount of bandwidth extension. There are several advantages to implementing wave forming in this manner. Many pre-emphasis or wave forming implementations are digital in nature, and so a clock is often required. This implementation is analog, and therefore requires no clock input. The time-delay blocks can be implemented by simple RC filters as shown in FIG. 10, and therefore dissipate no additional power. This type of implementation can be done in either a CMOS process or a bipolar process.

Figure 11:
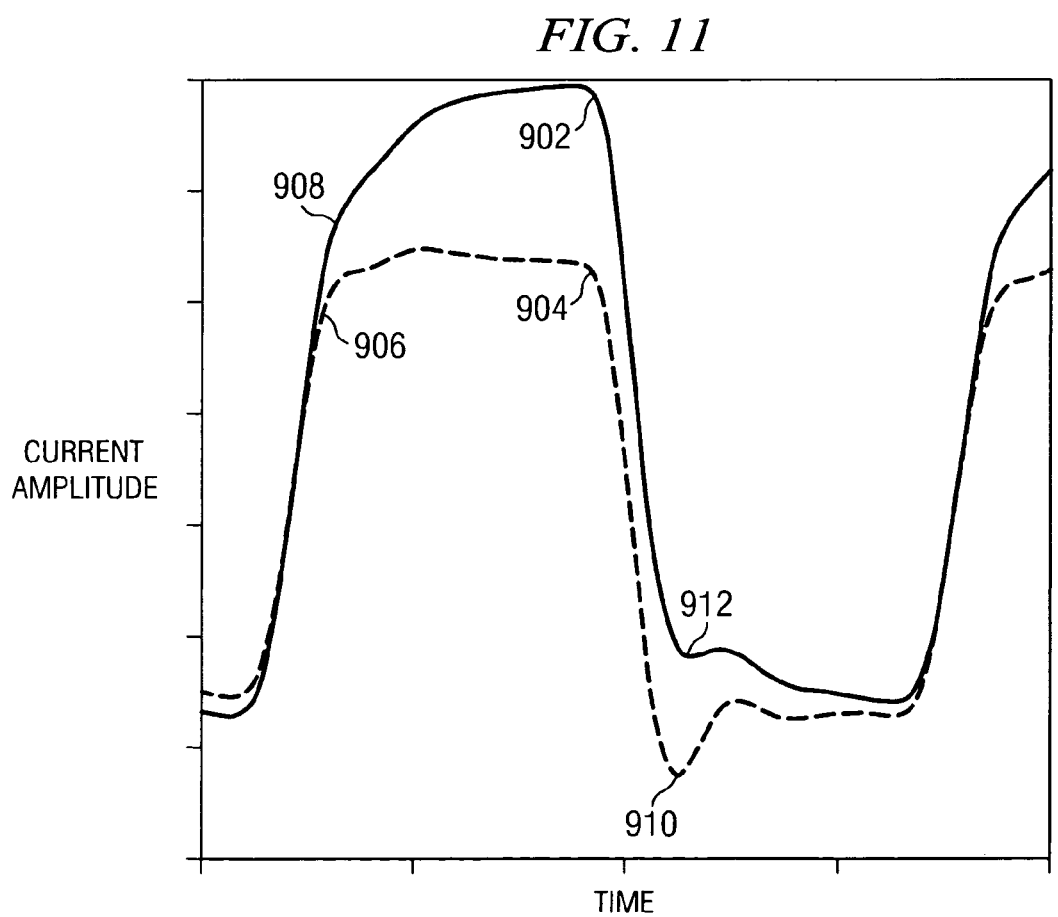
FIG. 11 is a waveform diagram illustrating the output of the wave shaping circuit.

FIG. 11 illustrates current amplitude versus time for a VCSEL operating with no-wave forming (curve 902) and with 25% wave forming using the circuit of FIG. 10 (curve 904). In the case where wave forming is applied, a rising edge 906 of curve 904 is better defined than the rising edge 908 of curve 902, making the logic value "1" easier to define. In addition, the falling-edge bounce is reduced through use of the circuit of FIG. 10 as illustrated at 910 and 912. The effect on the data eye is to improve the vertical eye opening by widening the top and bottom horizontal waveforms. In this case, the total vertical eye is smaller, because current is subtracted on both the rising and failing edges. Thus, a 25% increase in modulation current is needed in conjunction with the wave forming to obtain the same amount of modulation current with a wider vertical eye opening.

This method of wave forming is not the same as simply adding more modulation current from a laser driver. Systems typically need a specific modulation current level to achieve the desired extinction ratio, power budget, and reliability. Therefore, this method of wave forming allows for the same amount of modulation current with improved waveform integrity, at the cost of extra total supply current.

Figure 12:
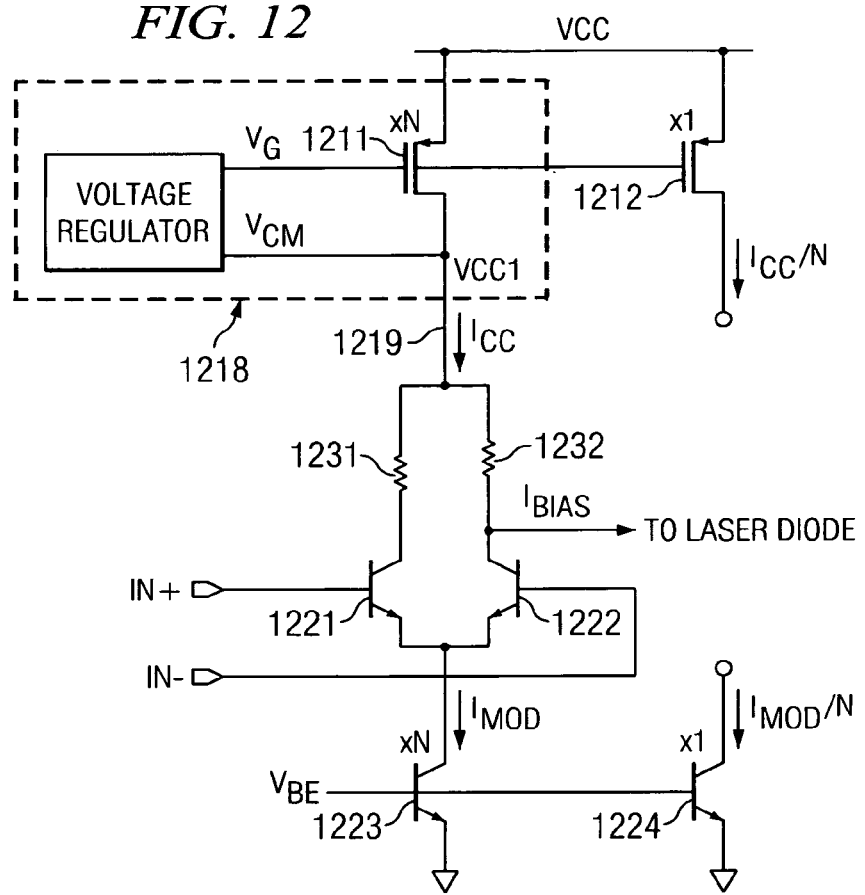
FIG. 12 is a circuit diagram illustrating another driver output stage.

FIG. 12 illustrates another exemplary driver amplifier in accordance with the present invention. The FIG. 12 circuit is similar to the previously described driver amplifier circuits, except that the circuit of FIG. 12 includes means for detecting a fault condition. As in the previously described embodiments, the FIG. 12 circuit includes a pair of differentially connected transistors 1221 and 1222 connected to load resistors 1231 and 1232, respectively, and a current source transistor 1223 connected between the common emitter connections of transistors 1221 and 1222 and ground. Also, dedicated voltage regulator 1218, including PMOS transistor 1211 provides a channel specific voltage on line 1219 to the common connection of resistors 1231 and 1232.

The circuit of FIG. 12 additionally includes a second PMOS transistor 1212 having a drain to source path connected between Vcc and a first output terminal, with its gate electrode connected to the gate electrode of PMOS transistor 1211, forming a current mirror. In addition, the circuit of FIG. 12 includes a fourth transistor 1224 having its collector to emitter path connected between a second output terminal and ground and its base connected to the same input voltage $V_{BE}$ as transistor 1223, forming a current mirror. The first and second output terminals are the input terminals to the circuit 1300 of FIG. 13.

Figure 13:
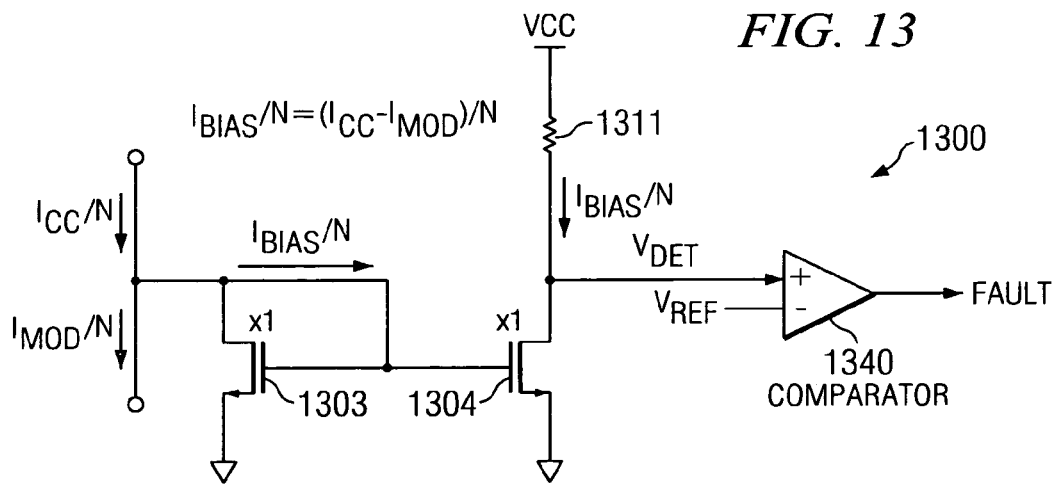
FIG. 13 is a circuit diagram illustrating a fault detection circuit in accordance with the present invention.

FIG. 13 includes an NMOS transistor 1303 for receiving the input bias current, and NMOS transistor 1304 coupled to transistor 1303 to form a current mirror. The drain to source path of transistor 1304 is connected in series with resistor 1311 forming a series connected path from Vcc to ground. The common connection of resistor 1311 and transistor 1304 is provided as an input to comparator 1340. Comparator 1340 receives a reference voltage ($V_{REF}$) as a second input and provides a FAULT signal as an output.

In operation, the circuit of FIG. 13 (with the circuit of FIG. 12) employs open circuit fault detection architecture to monitor current supplied to the laser. In this case, $I_{BIAS}$ is determined by measuring $I_{CC}$ and $I_{MOD}$ using current mirrors including transistors 1211/1212 and 1223/1224. More specifically, supply current $I_{CC}$ is monitored using transistor 1212, which is N times smaller than transistor 1211, establishing a 1:N current ratio between 1212 and 1211. Similarly, transistor 1224 is scaled to be N times smaller than transistor 1223, establishing a 1:N ratio between transistors 1224 and 1223. The output from the current mirrors is used to calculate $I_{BIAS}/N$, which is equal to $(I_{CC}-I_{MOD})/N$.

With continued reference to FIG. 12 and FIG. 13, in the illustrated embodiment, $I_{BIAS}/N$ is sent to the illustrated current mirror, which includes NMOS transistors 1303 and 1304, which are equal in size, such that the output current of 1304 is the same as the input current of 1303. The current $I_{BIAS}/N$ is then forced through resistor 1311, producing a voltage drop, $V_{DET}$, from $V_{CC}$. This voltage, $V_{DET}=V_{CC}-R3*I_{BIAS}/N$, is compared to a reference voltage $V_{REF}$ at a comparator 1340.

An open circuit laser diode results in the condition $I_{BIAS}=0$ when a fault is detected. Allowing for tolerances, resistor 1311 may be set such that $V_{DET}$ equals $V_{REF}$ at a detection threshold current (e.g., about 1 mA). If $V_{DET}$ exceeds $V_{REF}$, the comparator issues a high FAULT output, corresponding to an open circuit laser diode condition. This fault is then outputted from comparator to a desired control circuit (not shown) typically for shutting the system down.

What has then been described is a system, circuits and techniques for driving a laser diode to convert electrical signals into optical signals. What has also been described is a multi-channel system for driving a plurality of common cathode connected diodes in a laser diode array. For the multi-channel case, any number of channels can be operated in parallel, usually determined by the number of diodes in the laser diode array. In accordance with the invention, for the multi-channel case, a channel specific voltage is supplied to at least two of the common connected diodes in a laser diode array, by:

1. buffering first and second differential electrical input signals and providing first and second buffered differential electrical output signals to first and second differential amplifiers;

2. generating first and second regulated voltages in response to first and second control signals;

3. supplying the first regulated voltage and the first buffered electrical output signal to a first driver amplifier adapted to supply a drive voltage to the anode of a first one of the plurality of common cathode connected diodes; and 4. supplying the second regulated voltage and the second buffered electrical output signal to a second driver amplifier adapted to supply a drive voltage to the anode of a second one of the plurality of common cathode connected diodes.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by providing other configurations of transistors. These alternatives can be suitably selected depending upon the particular application or in consideration of any number of factors associated with the operation of the system. These and other changes or modifications are intended to be included within the scope of the present invention.

What is claimed is:

1. A system for driving an optoelectronic device, comprising:
   a buffer circuit for receiving a differential electrical signal;
   a dedicated voltage regulator having an input adapted to receive a control signal and an output adapted to provide an output voltage that is a function of the control signal; and
   a driver amplifier comprising a first amplifier having first and second differentially connected transistors and a first current source, a second amplifier having third and fourth differentially connected transistors and a second current source; a time delay network connected between the inputs of said first and second amplifiers and having a first input coupled to the output of said buffer circuit and a second input coupled to said voltage regulator and an output for providing a precisely controlled waveform to an optoelectronic device;

wherein a first input is coupled to the base of the first and third transistors and a second input is coupled to the base of the second and fourth transistors.

2. A system as in claim 1, wherein said buffer circuit comprises:
an attenuating input stage having a pair of resistors; and
an amplifying output stage.

3. A system as in claim 1, wherein said buffer circuit comprises:
an attenuating input stage having a pair of resistors; and
an amplifying output stage; and
said driver amplifier comprises:
first and second amplifying transistors adapted to receive a differential input at their respective base regions; and
first and second load resistors connected between the respective collector regions of said first and second transistors and the dedicated voltage regulator;
a common connection of the collector region of said second transistor and said second load resistor adapted to provide an output to an optoelectronic device.

4. A system as in claim 1, further comprising:
a laser diode.

5. A system as in claim 4, wherein said laser diode is a VCSEL.

6. A system as in claim 1 further comprising:
an additional buffer circuit for receiving a differential electrical signal;
an additional dedicated voltage regulator having an input adapted to receive a control signal and an output adapted to provide an output voltage that is a function of the control signal; and
an additional driver amplifier having a first input coupled to the output of said additional buffer circuit and a second input coupled to said additional voltage regulator and an output for providing a precisely controlled waveform to an additional optoelectronic device.

7. A system as in claim 6, wherein said optoelectronic device and said additional optoelectronic device are light emitting diodes formed as an integrated array.

8. A system as in claim 7, wherein said integrated array comprises:
VCSEL's.

9. A system as in claim 7 wherein said light emitting diodes have their cathodes connected in common and to ground.

10. A system as in claim 1 wherein the collector of the first transistor is connected to the collector of the fourth transistor and the collector of the second transistor is connected to the collector of the third transistor.

11. A system for driving an optoelectronic device, comprising:
a buffer circuit for receiving a differential electrical signal;
a dedicated voltage regulator having an input adapted to receive a control signal and an output adapted to provide an output voltage that is a function of the control signal; and
a driver amplifier comprising first and second amplifying transistors adapted to receive a differential input at their respective base regions, the emitters of said first and second transistors being connected to form a common node; first and second load resistors connected between the respective collector regions of said first and second transistors and the dedicated voltage regulator; a common connection of the collector region of said second transistor and said second load resistor adapted to provide an output to an optoelectronic device; a third transistor connected between said common node and ground; said dedicated voltage regulator has an output transistor; a fourth transistor connected to said output transistor forming a first current mirror; and a fifth transistor connected to said third transistor forming a second current mirror;
said driver amplifier having a first input coupled to the output of said buffer circuit and a second input coupled to said voltage regulator and an output for providing a precisely controlled waveform to an optoelectronic device.

12. A system as in claim 11, further comprising:
sixth and seventh transistors forming a third current mirror; and
a third resistor connected to said seventh transistor.

13. A system as in claim 12, further comprising:
a comparator connected to the common connection of said third resistor and said seventh transistor.

* * * * *